United States Patent
Oku (10) Patent No.: US 8,258,452 B2
(45) Date of Patent: Sep. 4, 2012

(54) LIGHT RECEIVING CIRCUIT

(75) Inventor: Setsuya Oku, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 452 days.

(21) Appl. No.: 12/591,930

(22) Filed: Dec. 4, 2009

(65) Prior Publication Data

US 2010/0148038 A1 Jun. 17, 2010

(30) Foreign Application Priority Data

Dec. 16, 2008 (JP) .................................. 2008-319987

(51) Int. Cl.
*H03F 3/08* (2006.01)
(52) U.S. Cl. .................. 250/214 A; 330/308; 250/214 R
(58) Field of Classification Search .............. 250/214 A, 250/214 R, 551; 330/308
See application file for complete search history.

(56) References Cited

U.S. PATENT DOCUMENTS 5,828,178 A * 10/1998 York et al. .................... 315/151

FOREIGN PATENT DOCUMENTS

JP 2004-328061 11/2004

* cited by examiner

*Primary Examiner* — Thanh X Luu
(74) *Attorney, Agent, or Firm* — McGinn IP Law Group, PLLC (57) ABSTRACT

Provided is a light receiving circuit including: a photodiode; a first amplifier including a feedback resistor connected between an input and an output of an inverting amplifier and having an input connected to a cathode of the photodiode; a second amplifier having a configuration similar to that of the first amplifier and having an input connected to an anode of the photodiode; a capacitor element connected between an output of the first amplifier and the input of the second amplifier; and a bias current control circuit that outputs a bias current to the input of the second amplifier according to a current value of the photocurrent, and controls an output voltage signal of the light receiving circuit according to an output of the second amplifier by using the bias current to adjust the sensitivity. The bias current control circuit changes the sensitivity according to the output of the second amplifier.

5 Claims, 10 Drawing Sheets

PRIOR ART

LIGHT RECEIVING CIRCUIT

BACKGROUND

1. Field of the Invention

The present invention relates to a light receiving circuit.

2. Description of Related Art

At present, photocouplers are widely used. Each photocoupler is used in a device including a drive unit operating at high voltage for industrial and consumer use in order to ensure electrical isolation between the drive unit operating at high voltage and a control unit operating at low voltage. The photocoupler transmits an electrical input signal to an output side by turning on/off light, and outputs the light as an electrical signal again.

Figure 5:
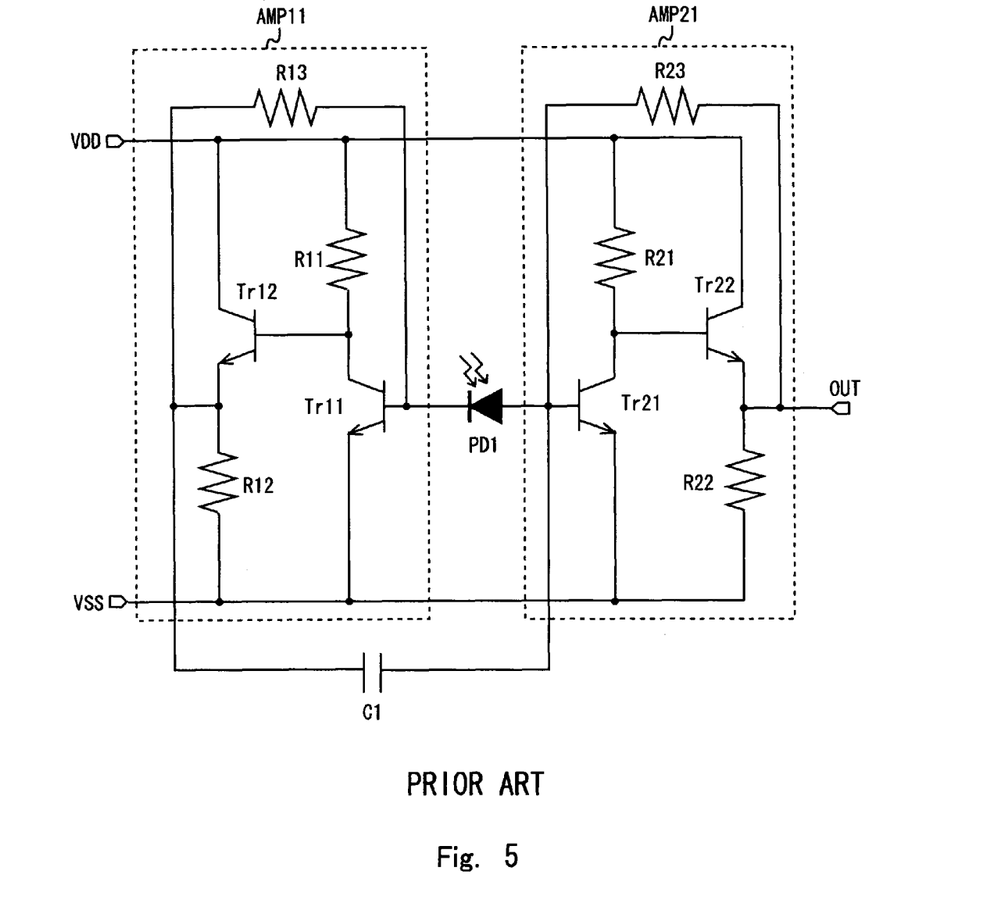
FIG. 5 shows a configuration of a light receiving circuit disclosed in Japanese Unexamined Patent Application Publication No. 2004-328061.

A general-purpose photocoupler is required to be low in price and high in reliability. A circuit configuration in which such a photocoupler can be used as a light receiving circuit is disclosed in Japanese Unexamined Patent Application Publication No. 2004-328061. FIG. 5 shows a circuit diagram of a light receiving circuit 1 of a prior art disclosed in Japanese Unexamined Patent Application Publication No. 2004-328061. As shown in FIG. 5, the light receiving circuit 1 includes a photodiode PD1, a capacitor element C1, NPN transistors Tr11, Tr12, Tr21, and Tr22, and resistor elements R11 to R13 and R21 to R23.

Figure 6:
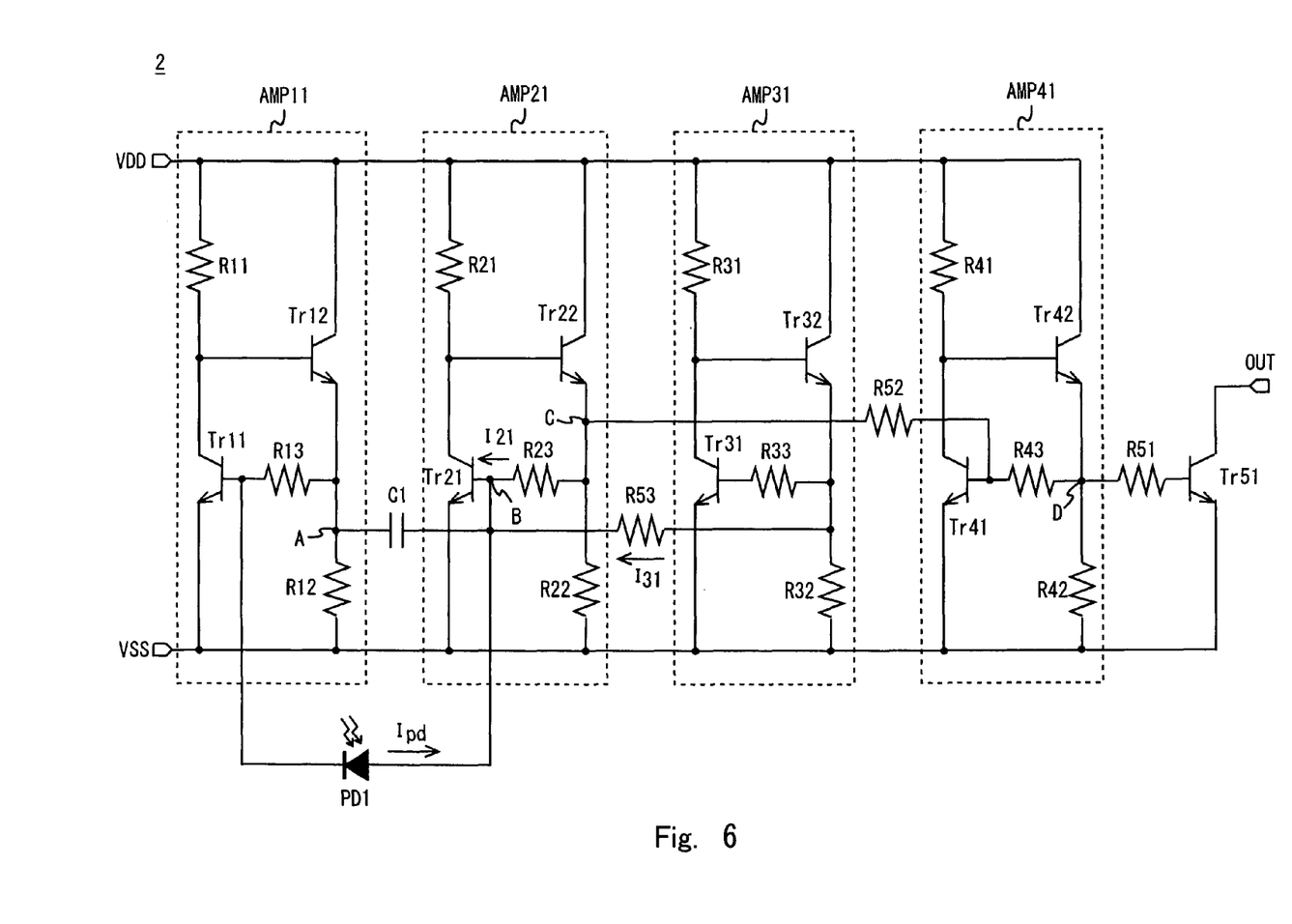
FIG. 6 shows a configuration of a light receiving circuit according to a related art.

Additionally, FIG. 6 shows an integrated circuit (hereinafter referred to as "light receiving circuit 2") of a related art, which employs the configuration of the light receiving circuit 1. As shown in FIG. 6, the light receiving circuit 2 includes the photodiode PD1, the NPN transistors Tr11, Tr12, Tr21, and Tr22, NPN transistors Tr31, Tr32, Tr41, Tr42, and Tr51, the resistor elements R11 to R13 and R21 to R23, and resistor elements R31 to R33, R41 to R43, and R51 to R53. Components of FIG. 6 denoted by the same reference symbols as those in FIG. 5 have the same configuration. The NPN transistors Tr11 and Tr12 and the resistor elements R11 to R13 constitute an amplifier AMP11. The NPN transistors Tr21 and Tr22 and the resistor elements R21 to R23 constitute an amplifier AMP21. The NPN transistors Tr31 and Tr32 and the resistor elements R31 to R33 constitute an amplifier AMP31. The NPN transistors Tr41 and Tr42 and the resistor elements R41 to R43 constitute an amplifier AMP41.

Figure 7:
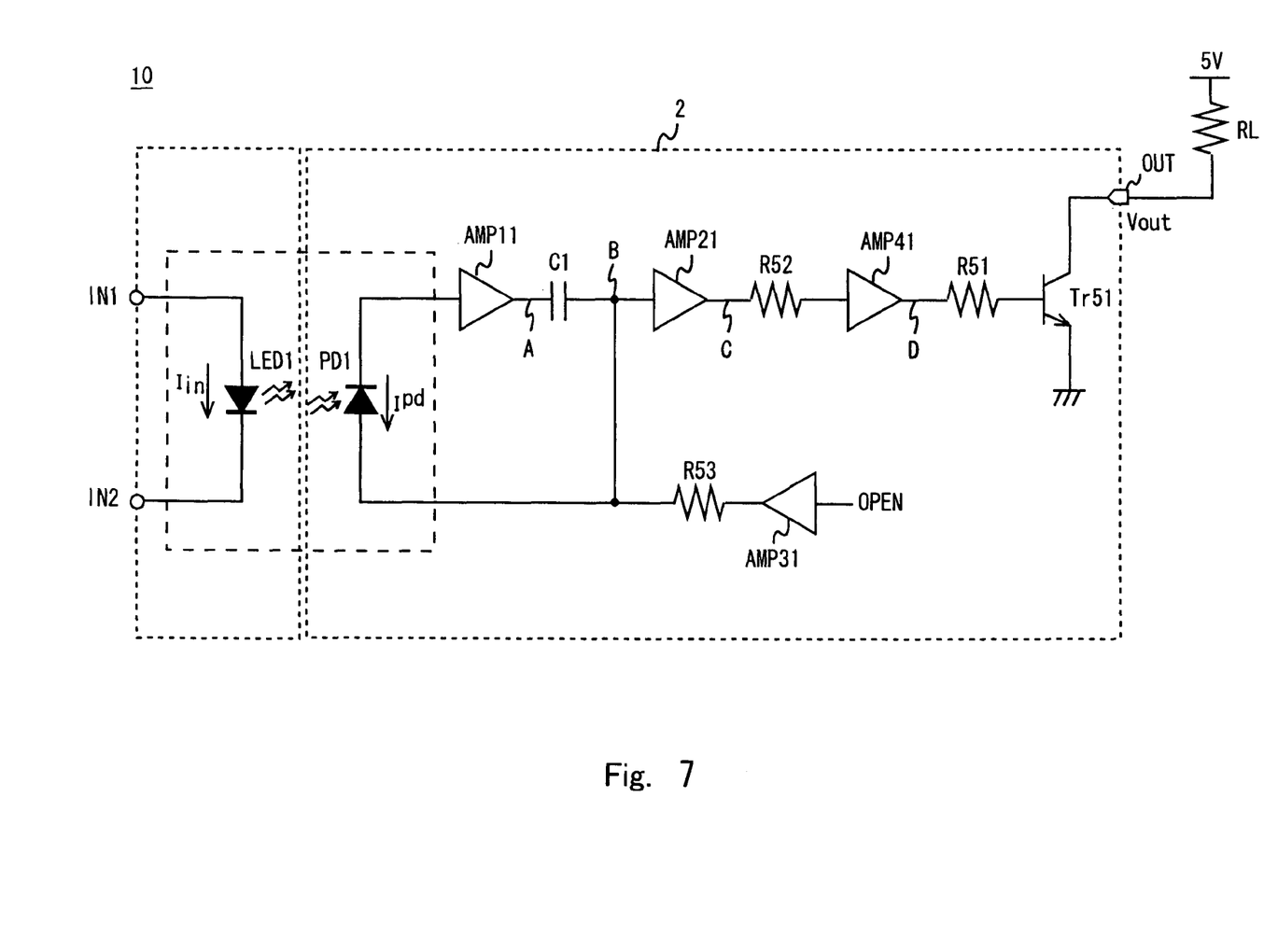
FIG. 7 is a block diagram showing a photocoupler according to the related art.

FIG. 7 is a block diagram showing a photocoupler 10 incorporating the light receiving circuit 2 shown in FIG. 6. The photocoupler 10 includes the light receiving circuit 2, input terminals IN1 and IN2, and a light emitting device LED1. The light emitting device LED1 is composed of a light emitting diode or the like. Components of FIG. 7 denoted by the same reference symbols as those in FIG. 6 have the same configuration.

The amplifier AMP11 is a transimpedance amplifier (current-voltage conversion amplifier) for shaping the waveform of an input signal of the amplifier AMP21 to improve a delay of an output signal of the light receiving circuit 2. An output signal of the amplifier AMP11 is input to the amplifier AMP21 through the capacitor element C1. The amplifier AMP21 is a transimpedance amplifier that converts a photocurrent Ipd, which is generated by the photodiode PD1, into a voltage signal. As seen from FIG. 6, the amplifiers AMP11 and AMP21 have the same circuit configuration. The input terminals of the amplifiers AMP11 and AMP21 are each connected to the photodiode PD1. In this configuration, even when a supply voltage of a power supply voltage VDD fluctuates, the amplifiers AMP11 and AMP21 operate in a similar manner with respect to the fluctuation. For this reason, this configuration has the characteristic of high resistance to noise.

When the photocurrent Ipd is equal to or smaller or larger than a predetermined current value, a bias current is supplied to an input transistor of the amplifier AMP21 so as to invert the phase of an output level of the amplifier AMP21. This function enables rapid inversion of the phase of an output voltage signal Vout which is described later, when the photocurrent Ipd reaches the predetermined current value. Thus, the amplifier AMP31 is an amplifier necessary for adjusting the sensitivity of the photocoupler 10. Also the amplifier AMP31 has the same circuit configuration as that of the amplifiers AMP11 and AMP21 so that the resistance to power supply noise is increased. A current I31 output from the amplifier AMP31 flows through the resistor element R53. A current I21 is a base current of the NPN transistor Tr21 which serves as the input transistor of the amplifier AMP21. The current I21 herein described is equal to a sum of the photocurrent Ipd and the current I31. When the current I31 is caused to flow from the amplifier AMP31, the sensitivity of the light receiving circuit 2 can be improved compared to the case where only the photocurrent Ipd is caused to flow. Moreover, setting of the sensitivity can be changed by adjusting a resistance value of the resistor element R52.

The amplifier AMP41 amplifies a signal output from the amplifier AMP21 and outputs the amplified signal. Then, the output signal drives the NPN transistor Tr51 which serves as an output transistor. The NPN transistor Tr51 is connected in an open collector configuration.

Figure 8A:
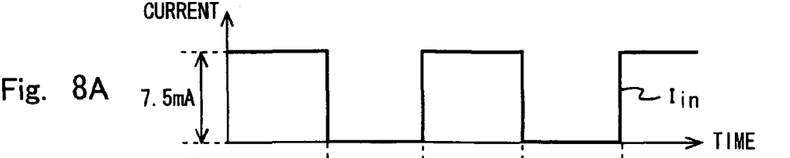
FIGS. 8A to 8G show operation waveforms of components of the photocoupler according to the related art.
Figure 8B:
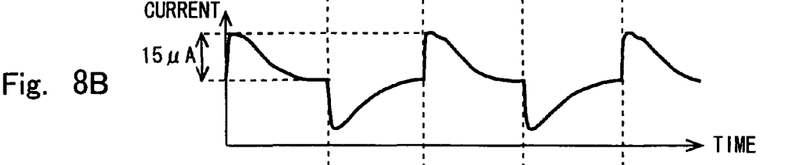

The operation of the photocoupler 10 will be described below with reference to FIGS. 8A to 8G. It is assumed that an output terminal OUT is applied with a bias voltage of 5V. FIGS. 8A and 8B show current waveforms and FIGS. 8C to 8G show voltage waveforms.

First, an input current signal Iin as shown in FIG. 8A is input to each of the input terminals IN1 and IN2. In response to the input current signal Iin, the light emitting device LED1 emits light. The light-receiving element PD1 receives the light signal from the light emitting device LED 1. In response to the received light signal, the light-receiving element PD1 outputs the photocurrent Ipd.

Figure 8C:
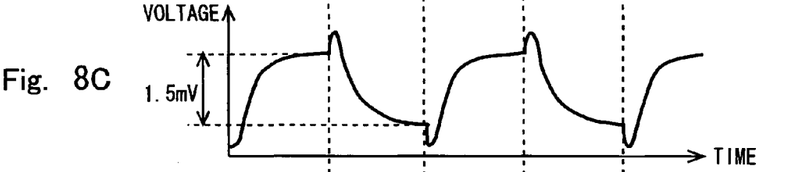

The amplifier AMP21 receives a voltage signal as shown in FIG. 8C. The voltage signal is generated from the photocurrent Ipd at a node B. The base of the input transistor (NPN transistor Tr21) of the amplifier AMP21 receives a current having a waveform shown in FIG. 8B which is described later.

Figure 8D:
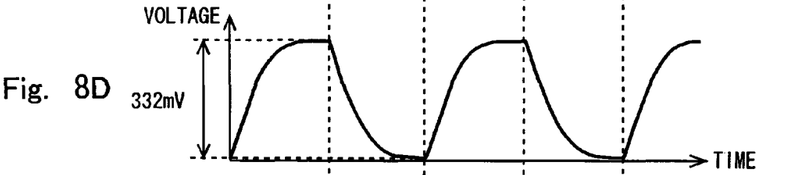
Figure 8E:
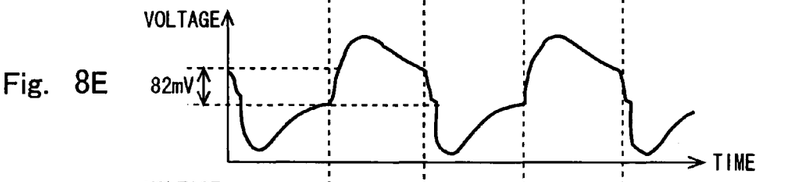

The amplifier AMP11 converts a photocurrent, which is generated by a parasitic diode of the photodiode PD1, into a voltage signal as shown in FIG. 8D, and outputs the voltage signal to a node A. The voltage signal is transmitted to the node B through the capacitor element C1. Thus, the current injected into the base of the input transistor of the amplifier AMP21 has a waveform as shown in FIG. 8B. In this manner, the output waveform of the amplifier AMP11 is transmitted to the node B through the capacitor element C1, thereby shaping the waveform of the current signal input to the amplifier AMP21. Further, the rise time and fall time of a signal shown in FIG. 8E, which is output to a node C by the amplifier AMP21, is shortened. This is effective for providing an improvement in propagation delay time of the photocoupler 10.

Figure 8F:
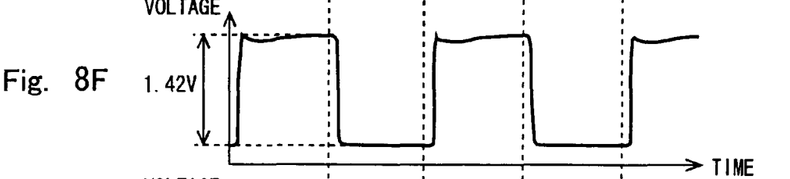

The amplifier AMP41 receives the signal output to the node C by the amplifier AMP21. The amplifier AMP41 then amplifies the output signal of the amplifier AMP21, and outputs a signal having a waveform as shown in FIG. 8F to a node D.

Figure 8G:
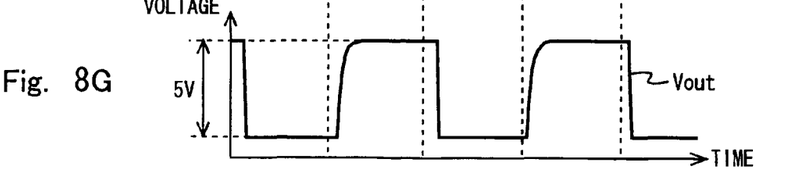

The NPN transistor Tr51 is driven by a voltage signal output to the node D by the amplifier AMP41. When the NPN transistor Tr51 is in an ON state, the output voltage signal Vout at the output terminal OUT is at a low level. When the NPN transistor Tr51 is in an OFF state, the output voltage signal Vout is at a high level. Accordingly, the output voltage signal Vout is a voltage signal having a waveform as shown in FIG. 8G.

In a general-purpose photocoupler required to be low in price and high in reliability, the photocoupler 10 has a major advantage of requiring a small number of circuit elements, having high resistance to power supply noise, and capable of high-speed operation.

Figure 9:
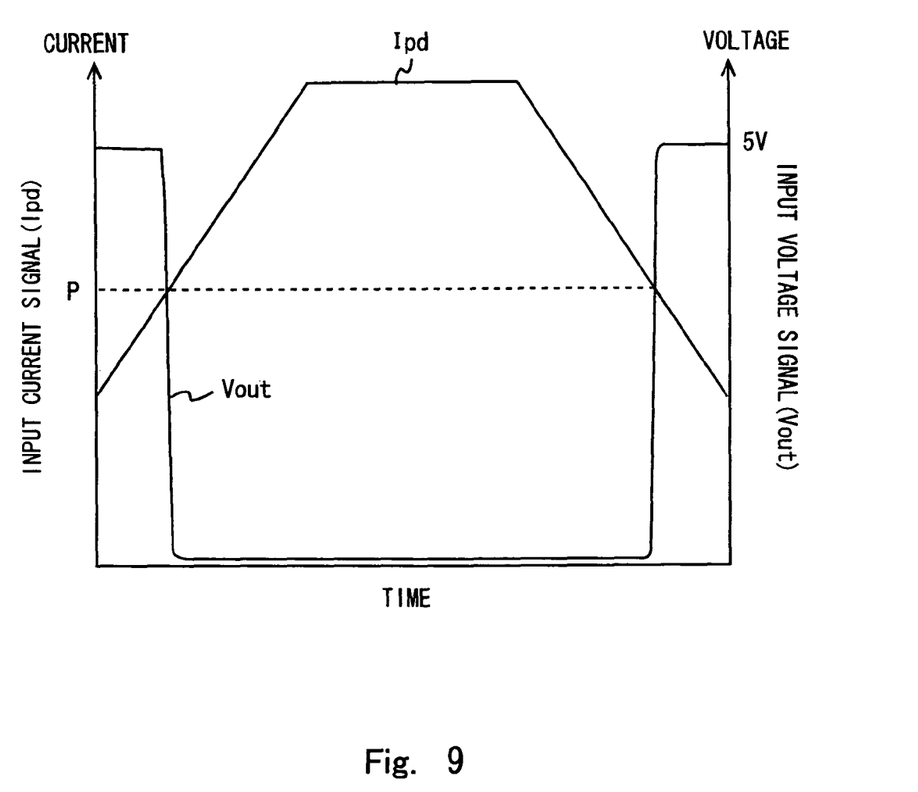
FIG. 9 shows operation waveforms of the light receiving circuit according to the related art.

FIG. 9 shows a relationship between the photocurrent Ipd which is the input signal of the light receiving circuit 2 of the photocoupler 10 and the output voltage signal Vout as described above. As shown in FIG. 9, when the photocurrent Ipd gradually increases and reaches a predetermined value P, the output voltage signal Vout falls. On the contrary, when the photocurrent Ipd gradually decreases and reaches the predetermined value P, the output voltage signal Vout rises. A point at which the current value of the photocurrent Ipd reaches the predetermined value P is hereinafter referred to as "sensitivity point". Thus, in the light receiving circuit 2, the output voltage signal Vout rises or falls at the time when the current value of the photocurrent Ipd, which is the input signal, reaches the sensitivity point. That is, the light receiving circuit 2 has no hysteresis characteristics with respect to input and output signals.

SUMMARY

Figure 10:
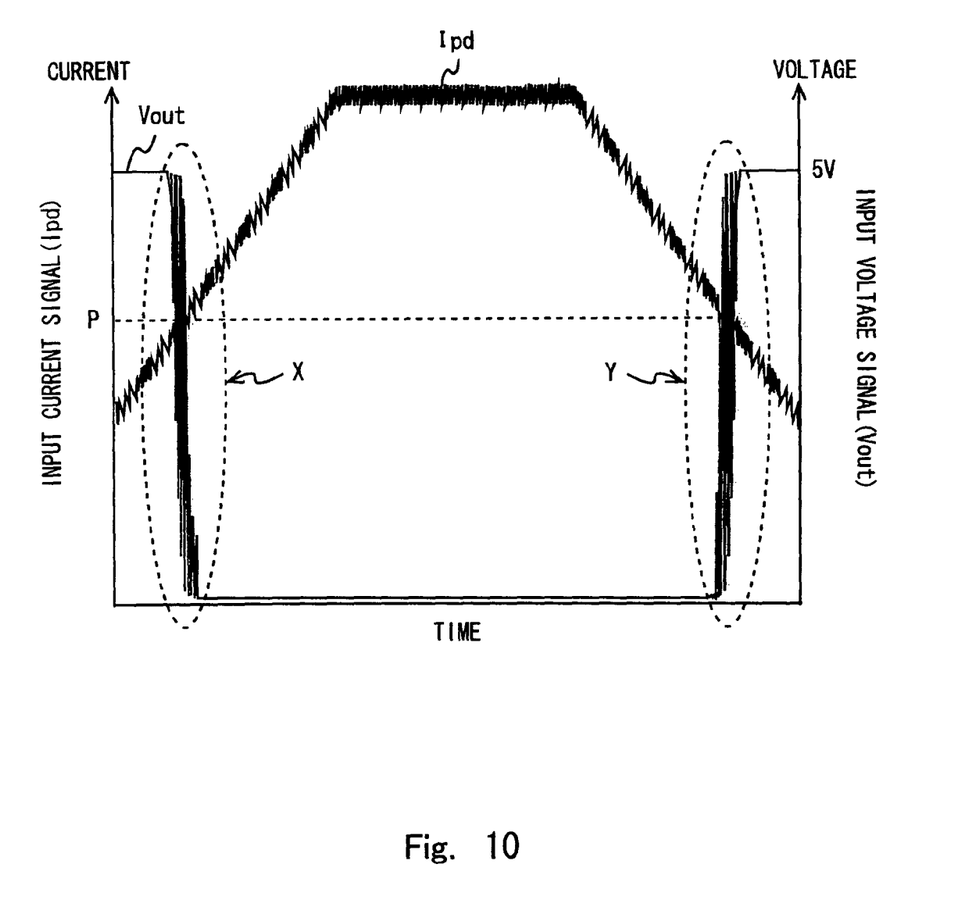
FIG. 10 shows operation waveforms of the light receiving circuit according to the related art.

The present inventor has found a problem as described below. The photocurrent Ipd generated by the photodiode PD1, which is actually manufactured as a product, contains noise components. FIG. 10 shows a relationship between the photocurrent Ipd, which is an input current signal and contains noise components, and the output voltage signal Vout. As shown in FIG. 10, when the photocurrent Ipd containing noise components reaches approximately the current value P, which corresponds to the sensitivity point, noise is also caused in the output voltage signal Vout due to the noise components, as shown in X and Y portions of FIG. 10. This is because the light receiving circuit 2 outputs the output voltage signal Vout which follows minute current changes, i.e., noise components in the photocurrent Ipd. This causes a problem that the noise in the photocurrent Ipd may cause the light receiving circuit 2 to malfunction.

In order to solve this problem, it is generally considered that a hysteresis characteristic is imparted to the input signal. In this case, however, a circuit for imparting the hysteresis characteristic is realized using a differential amplifier circuit or the like in many cases, which results in a problem of an increase in circuit size.

A first exemplary aspect of the present invention is a light receiving circuit including: a photodiode that outputs a photocurrent in response to a received light signal; a first amplifier including a feedback resistor connected between an input terminal and an output terminal of an inverting amplifier, and having an input terminal connected to a cathode of the photodiode; a second amplifier having a configuration similar to that of the first amplifier, and having an input terminal connected to an anode of the photodiode; a capacitor element connected between an output terminal of the first amplifier and the input terminal of the second amplifier; and a bias current control circuit that outputs a bias current to the input terminal of the second amplifier according to a current value of the photocurrent, and controls an output voltage signal of the light receiving circuit according to an output of the second amplifier by using the bias current to adjust sensitivity of the light receiving circuit. The bias current control circuit changes the sensitivity according to the output of the second amplifier.

In the light receiving circuit according to the first exemplary aspect of the present invention, the bias current control circuit is capable of changing the sensitivity of the light receiving circuit according to the output of the second amplifier. Meanwhile, the second amplifier changes the phase of the output signal of the second amplifier itself according to a photocurrent signal. As a result, the light receiving circuit has a hysteresis characteristic for providing different sensitivities between the rising edge and the falling edge of the photocurrent signal. Consequently, even when the photocurrent signal contains minute current changes, i.e., noise components, output signal characteristics are prevented from being affected by the noise.

The light receiving circuit according to an exemplary aspect of the present invention prevents occurrence of a malfunction while suppressing an increase in circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
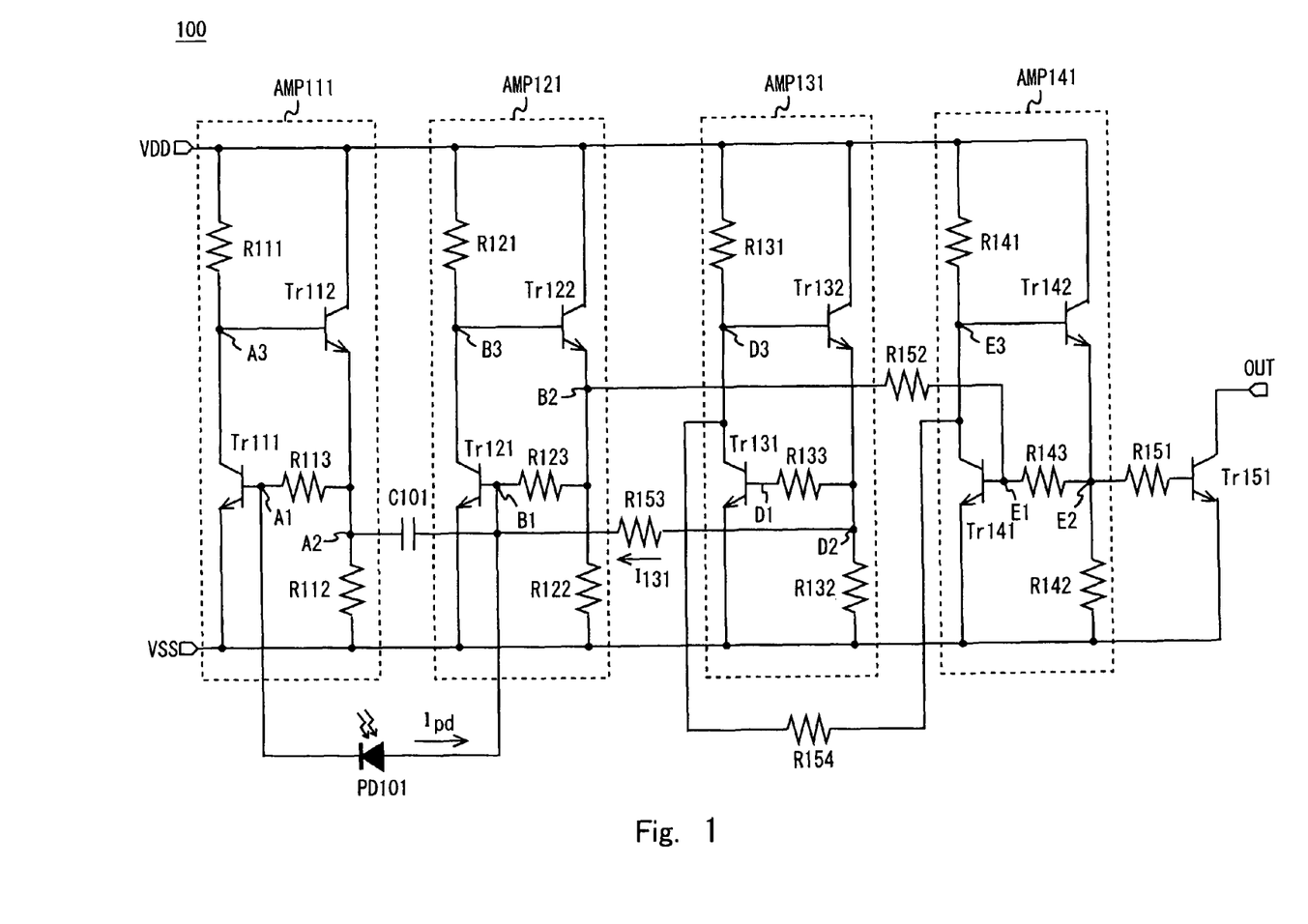
FIG. 1 shows an exemplary configuration of a light receiving circuit according to an exemplary embodiment of the present invention.

Exemplary embodiments of the present invention will be described in detail below with reference to the accompanying drawings. In this exemplary embodiment, the present invention is applied to a light receiving circuit of a photocoupler. FIG. 1 shows an exemplary configuration of a light receiving circuit 100 according to this exemplary embodiment.

As shown in FIG. 1, the light receiving circuit 100 includes amplifiers AMP111, AMP121, AMP131, and AMP141, a photodiode PD101, a capacitor element C101, an NPN transistor Tr151, and resistor elements R151 to R153.

The amplifier AMP111 includes NPN transistors Tr111 and Tr112 and resistor elements R111 to R113. The NPN transistor Tr111 has a collector connected to a node A3, an emitter connected to a ground voltage terminal VSS, and a base connected to a node A1. The NPN transistor Tr112 has a collector connected to a power supply voltage terminal VDD, an emitter connected to a node A2, and a base connected to the node A3. The resistor element R111 has one terminal connected to the power supply voltage terminal VDD, and the other terminal connected to the node A3. The resistor element R112 has one terminal connected to the node A2, and the other terminal connected to the ground voltage terminal VSS. The resistor element R113 has one terminal connected to the node A1, and the other terminal connected to the node A2. The node A1 serves as an input terminal of the amplifier AMP111, and the node A2 serves as an output terminal of the amplifier AMP111. For ease of explanation, the reference symbols "VDD" and "VSS" represent terminal names, and also represent a power supply voltage and a ground voltage, respectively.

The amplifier AMP121 includes NPN transistors Tr121 and Tr122 and resistor elements R121 to R123. The NPN transistor Tr121 has a collector connected to a node B3, an emitter connected to the ground voltage terminal VSS, and a base connected to a node B1. The NPN transistor Tr122 has a collector connected to the power supply voltage terminal VDD, an emitter connected to a node B2, and a base connected to the node B3. The resistor element R121 has one terminal connected to the power supply voltage terminal VDD, and the other terminal connected to the node B3. The resistor element R122 has one terminal connected to the node B2, and the other terminal connected to the ground voltage terminal VSS. The resistor element R123 has one terminal connected to the node B1, and the other terminal connected to the node B2. The node B1 serves as an input terminal of the amplifier AMP121, and the node B2 serves as an output terminal of the amplifier AMP121.

The amplifier AMP131 includes NPN transistors Tr131 and Tr132 and resistor elements R131 to R133. The NPN transistor Tr131 has a collector connected to a node D3, an emitter connected to the ground voltage terminal VSS, and a base connected to a node D1. The NPN transistor Tr132 has a collector connected to the power supply voltage terminal VDD, an emitter connected to a node D2, a base connected to the node D3. The resistor element R131 has one terminal connected to the power supply voltage terminal VDD, and the other terminal connected to the node D3. The resistor element R132 has one terminal connected to the node D2, and the other terminal connected to the ground voltage terminal VSS. The resistor element R133 has one terminal connected to the node D1, and the other terminal connected to the node D2. The node D1 serves as an input terminal of the amplifier AMP131, and the node D2 serves as an output terminal of the amplifier AMP131.

The amplifier AMP141 includes NPN transistors Tr141 and Tr142 and resistor elements R141 to R143. The NPN transistor Tr141 has a collector connected to a node E3, an emitter connected to the ground voltage terminal VSS, and a base connected to a node E1. The NPN transistor Tr142 has a collector connected to the power supply voltage terminal VDD, an emitter connected to a node E2, and a base connected to the node E3. The resistor element R141 has one terminal connected to the power supply voltage terminal VDD, and the other terminal connected to the node E3. The resistor element R142 has one terminal connected to the node E2, and the other terminal connected to the ground voltage terminal VSS. The resistor element R143 has one terminal connected to the node E1, and the other terminal connected to the node E2. The node E1 serves as an input terminal of the amplifier AMP141, and the node E2 serves as an output terminal of the amplifier AMP141.

The resistor element R151 has one terminal connected to the node E2, and the other terminal connected to the base of the NPN transistor Tr151. The resistor element R152 has one terminal connected to the node B2, and the other terminal connected to the node E1. The resistor element R153 has one terminal connected to the node D2, and the other terminal connected to the node B1. The capacitor element C101 has one terminal connected to the node A2, and the other terminal connected to the node B1. The NPN transistor Tr151 has a collector connected to an output terminal OUT, an emitter connected to the ground voltage terminal VSS, and a base connected to the other end of the resistor element R151. The photodiode PD101 has an anode connected to the node B1, and a cathode connected to the node A1.

Figure 2:
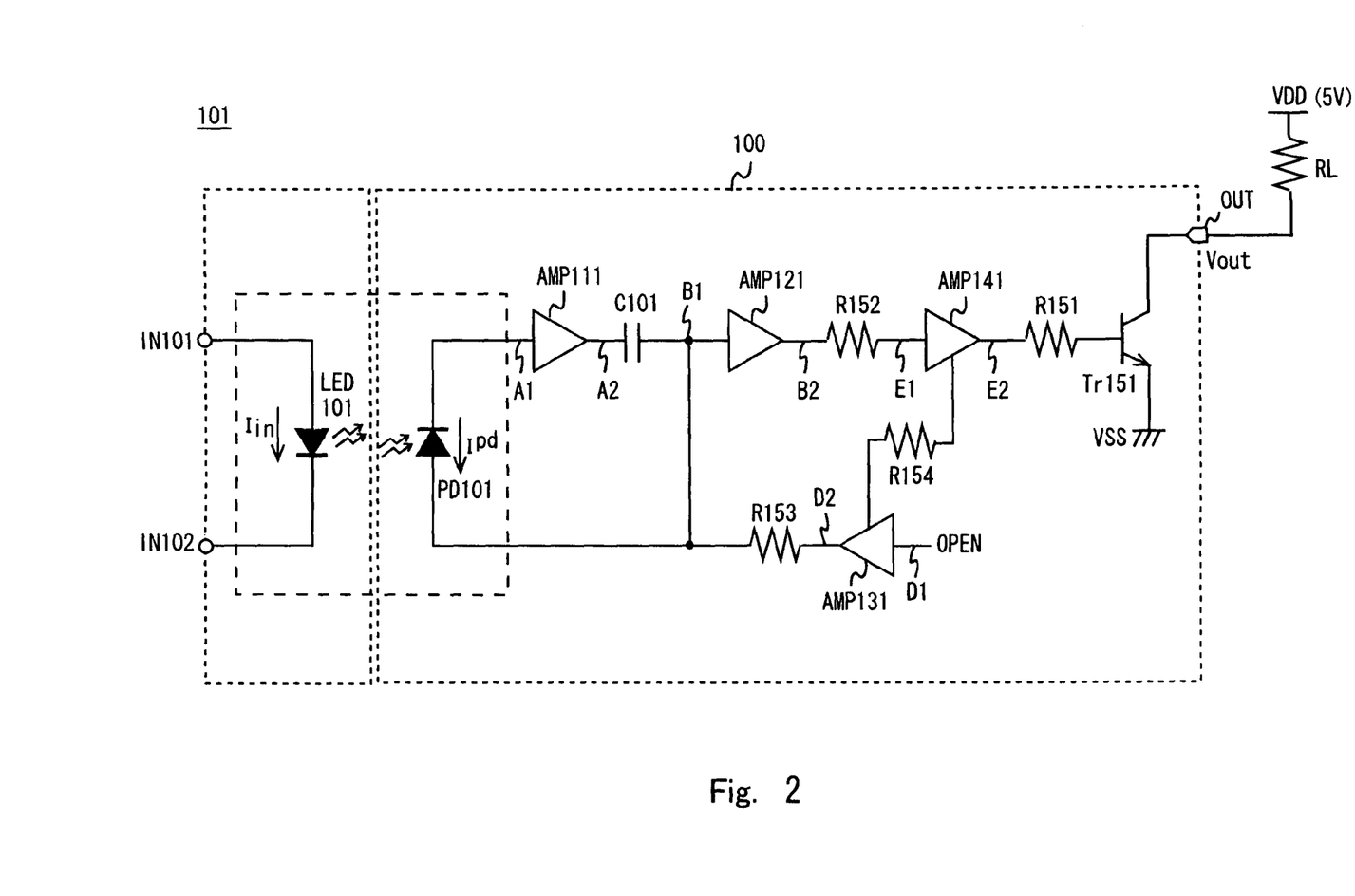
FIG. 2 is a block diagram showing a photocoupler according to an exemplary embodiment of the present invention.

Reference is now made to FIG. 2 which is a block diagram showing a photocoupler 101 incorporating the light receiving circuit 100 shown in FIG. 1. It is assumed herein that the NPN transistor Tr151, which serves as an output transistor, is connected in an open collector configuration. In this configuration, the output terminal OUT is connected to a pull-up resistor RL. The pull-up resistor RL has one terminal connected to the power supply voltage terminal VDD (e.g., power supply of 5V), and the other terminal connected to the output terminal OUT. The photocoupler 101 includes the light receiving circuit 100, input terminals IN101 and IN102, and a light emitting device LED101. The light emitting device LED101 is composed of a light emitting diode, and has an anode connected to the input terminal IN101, and a cathode connected to the input terminal IN102. Both the light emitting device LED101 and the photodiode PD101 are encapsulated in one package. The photodiode PD101 receives light emitted from the light emitting device LED 101. The photodiode PD101 outputs the photocurrent Ipd in response to the received light signal. Accordingly, the photocurrent Ipd is an input current signal for the light receiving circuit 100.

Note that components of FIG. 2 denoted by the same reference symbols as those in FIG. 1 have the same configuration. The circuit configurations of the amplifiers AMP111 to AMP141 are similar to those of the amplifiers AMP11 to AMP41 of FIG. 6, and the basic operations of the amplifiers AMP111 to AMP141 are also similar to those of the amplifiers AMP11 to AMP41. In other words, the amplifiers AMP111 and AMP121 are current-voltage conversion amplifiers having functions similar to those of the amplifiers AMP11 and AMP21. The amplifier AMP131 is a bias current control circuit that supplies a bias current to the input transistor of the amplifier AMP121 according to the photocurrent Ipd so as to adjust the sensitivity of the photocoupler 101. The amplifier AMP141 amplifies a signal output from the amplifier AMP121 and outputs the amplified signal.

The photodiode PD101, the NPN transistor Tr151, the capacitor element C101, and the resistor elements R151 to R153 respectively correspond to the photodiode PD1, the NPN transistor Tr51, the capacitor element C1, and the resistor elements R51 to R53 shown in FIG. 6, and the basic operations thereof are also similar to each other. The basic operations of the components shown in FIG. 2 are similar to the circuit operations shown in FIGS. 6 and 7, so the description thereof is omitted. The light receiving circuit 100 of this exemplary embodiment has a configuration in which a resistor element R154 is additionally provided to a light receiving circuit 2 shown in FIG. 6.

Figure 3:
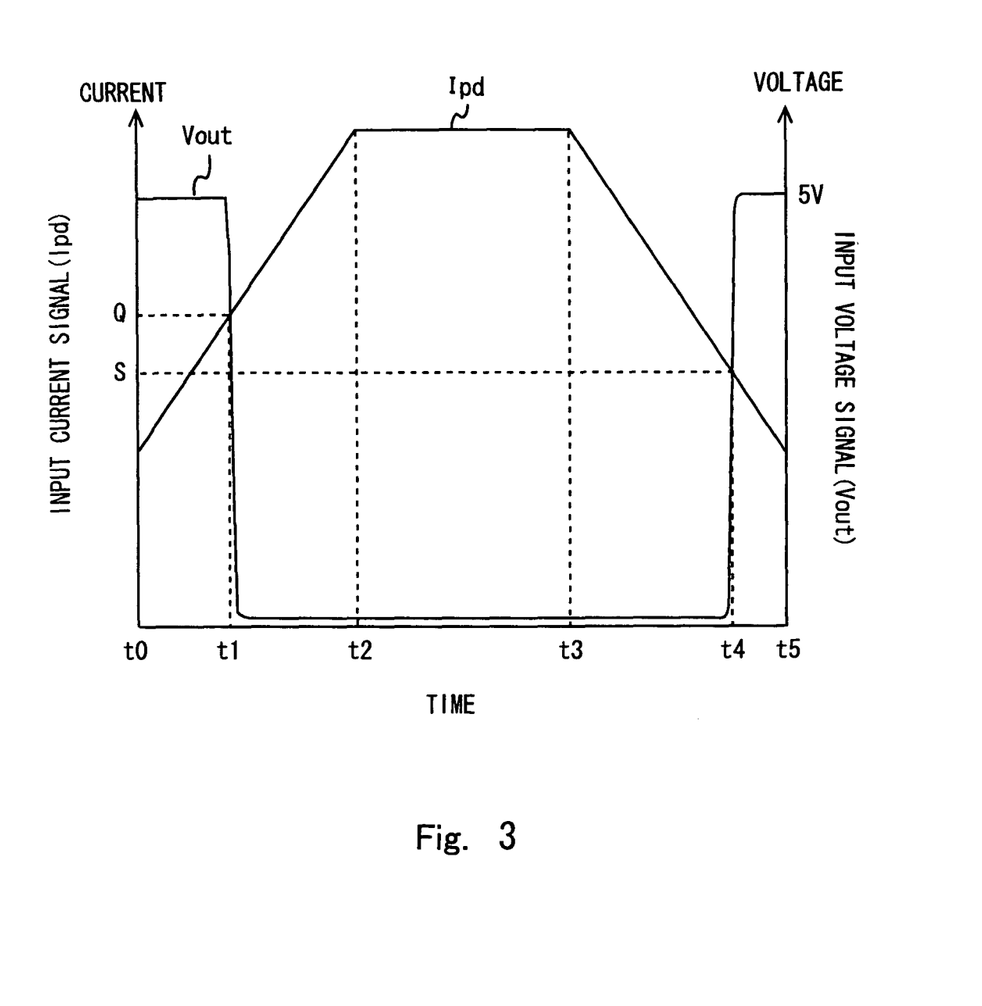
FIG. 3 shows operation waveforms of the light receiving circuit according to an exemplary embodiment of the present invention.

The operation of the light receiving circuit 100 will be described below with reference to FIG. 3. FIG. 3 shows a relationship between the photocurrent Ipd, which is the input signal of the light receiving circuit 100 of the photocoupler 101, and the output voltage signal Vout.

First, consideration is given to a case where no input current signal Iin is input to the input terminals IN101 and IN102, i.e., a case where the input current signal Iin is at a low level. In this case, the photodiode PD101 receives no light signal, and the photocurrent Ipd indicates "0", i.e., the photocurrent Ipd is at the low level.

Each of the amplifiers AMP111 to AMP141 herein described serves as an inverting amplifier. Because the photocurrent Ipd, which is the input signal, is at the low level, the output of the amplifier AMP121 becomes a high level. That is, because the NPN transistor Tr121 serving as the input transistor of the amplifier AMP121 is turned off, the node B1 becomes the low level.

Because the output from the amplifier AMP121 is at the high level, the output of the amplifier AMP141 becomes the low level. That is, the NPN transistor Tr141 is turned on, and the voltage at the node E3 has a low voltage value. Accordingly, a current flowing through the resistor element R154 has a low current value. The output of the amplifier AMP131 is at the low level, and a current supplied to the node B1 through the resistor element R153 also has a low current value. In this case, the amplifier AMP131 has a function similar to that of the amplifier AMP31 shown in FIG. 6. In other words, the amplifier AMP131 has a function for adjusting the sensitivity of the light receiving circuit 100. As described above, in the light receiving circuit 100, the node E3 and the node D3 are connected to each other through the resistor element R154. For this reason, the sensitivity of the light receiving circuit 100 is adjusted according to the potential level of the node E3. When the photocurrent Ipd, which is the input signal, is at the low level and the potential level of the node E3 is low, the amount of current supplied to the node D3 is small. As a result, the sensitivity of the light receiving circuit 100 is maintained at the low level. This sensitivity is represented as a sensitivity point Q in FIG. 3.

Next, consideration is given to a case where the input current signal Iin is input to each of the input terminals IN101 and IN102 and the input current signal Iin rises to the high level. In this case, the photodiode PD101 receives a light signal and the current value of the photocurrent Ipd increases. That is, the photocurrent Ipd rises to the high level (during times t0 to t2 of FIG. 3).

As described above, the sensitivity of the light receiving circuit 100 is represented as the sensitivity point Q in FIG. 3. When the input current signal Ipd gradually increases and becomes larger than the sensitivity point Q at the time t1, the output voltage signal Vout is inverted to the low level, i.e., the potential level of the node E2 becomes high. At this time, the NPN transistor Tr141 is turned off and the voltage at the node E3 rises. In this case, the node E3 and the node D3 are connected to each other through the resistor element R154. Accordingly, a current I131 which is supplied to the node B1 by the amplifier AMP131 increases according to the voltage at the node E3. As a result, the sensitivity of the light receiving circuit 100 also increases. This sensitivity is represented as a sensitivity point S in FIG. 3.

In this way, when the phase of the output voltage signal Vout is inverted, the sensitivity of the light receiving circuit 100 shifts from a low sensitivity state (sensitivity point Q) to a high sensitivity state (sensitivity point S). This shift occurs after the phase of the output voltage signal Vout is inverted, i.e., after the time t1. Accordingly, the potential level of the output voltage signal Vout is stabilized without being affected by the shift.

Next, consideration is given to a case where input of the input current signal En to each of the input terminals IN101 and IN102 is interrupted and the input current signal Iin falls to the low level. At this time, the photodiode PD101 receives no light signal and the current value of the photocurrent Ipd decreases. That is, the photocurrent Ipd falls to the low level (during times t3 to t5 of FIG. 3).

As described above, the sensitivity of the light receiving circuit 100 is represented as the sensitivity point S in FIG. 3. When the input current signal Ipd gradually decreases and becomes smaller than the sensitivity point S at the time t4, the output voltage signal Vout is inverted to the high level, i.e., the potential level of the node E2 becomes low. At this time, the NPN transistor Tr141 is turned on again and the voltage at the node E3 drops. In this case, the node E3 and the node D3 are connected to each other through the resistor element R154. Accordingly, the current I131 which is supplied to the node B1 by the amplifier AMP131 decreases according to the voltage at the node E3. As a result, the sensitivity of the light receiving circuit 100 decreases again. That is, the sensitivity returns to the sensitivity point Q shown in FIG. 3 again.

In this way, when the phase of the output voltage signal Vout is inverted, the sensitivity of the light receiving circuit 100 shifts from the high sensitivity state (sensitivity point S) to the low sensitivity state (sensitivity point Q). This shift occurs after the phase of the output voltage signal Vout is inverted, i.e., after the time t4. Accordingly, the potential level of the output voltage signal Vout is stabilized without being affected by the shift. After that, the above-mentioned operations are repeated according to the input current signal Iin of each of the input terminals IN101 and IN102, i.e., according to the input current signal Ipd in the light receiving circuit 100.

Figure 4:
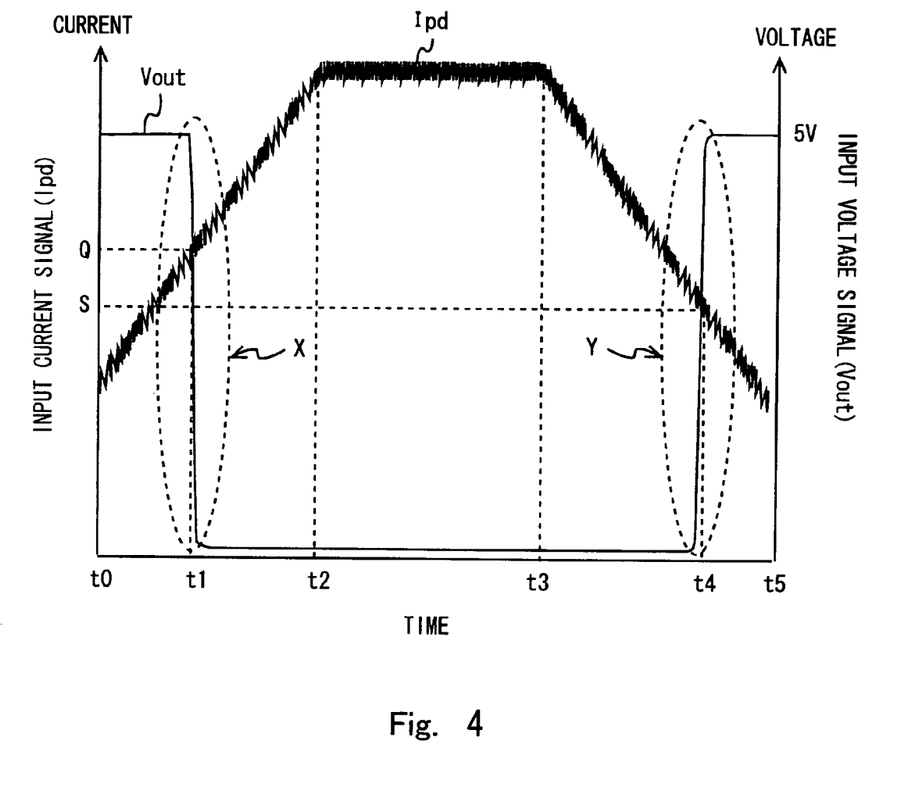
FIG. 4 shows operation waveforms of the light receiving circuit according to an exemplary embodiment of the present invention.

Referring now to FIG. 4 which shows a relationship between the photocurrent Ipd, which is an input current signal and contains noise components, and the output voltage signal Vout. As indicated by X and Y portions of FIG. 4, even when the photocurrent Ipd containing noise reaches approximately the current values Q and S, which correspond to the sensitivity points, no "fluctuations" occur in the output voltage signal Vout. This is because minute current change components, i.e., noise components in the photocurrent Ipd are small relative to the hysteresis of the sensitivity, and the light receiving circuit 100 does not respond to minute current changes in the photocurrent Ipd.

The light receiving circuit 2 of the related art shown in FIG. 6 has a problem in that noise components of the photocurrent Ipd generated by the photodiode PD1 may cause a malfunction. This is because the amplifiers provided in the light receiving circuit 2 follow minute current changes, i.e., noise components in the photocurrent Ipd in the vicinity of the sensitivity points of the light receiving circuit 2. As a result, the output voltage signal Vout fluctuates greatly. In order to avoid this phenomenon, it is conceivable that a differential amplifier or the like which incorporates therein a hysteresis circuit is inserted. When a circuit such as a differential amplifier is added, however, the circuit size increases, which results in a problem of an increase in manufacturing costs and the like.

In the light receiving circuit 100 of this exemplary embodiment, the resistor element R154 is connected between the nodes E3 and D3, thereby imparting a hysteresis characteristic to the light receiving circuit 100. The hysteresis characteristic allows elimination of fluctuations in the output voltage signal Vout with respect to minute current changes in the photocurrent Ipd. In addition to this effect, the number of components to be added to the light receiving circuit 2 is reduced substantially to one, i.e., one resistor element, thereby preventing an increase in circuit size. Therefore, the light receiving circuit 100 can prevent occurrence of a malfunction while achieving high reliability and low prices. Moreover, the hysteresis characteristic is imparted to the light receiving circuit 100, thereby preventing a malfunction from occurring due to noise in the power supply voltage VDD.

The present invention is not limited to the above exemplary embodiments, and can be modified in various manners without departing from the scope of the present invention. For example, the light receiving circuit 100 is configured to increase the sensitivity at the rising edge of the input current signal Ipd and decrease the sensitivity at the falling edge of the input current signal Ipd. Alternatively, the light receiving circuit 100 may be configured to increase the sensitivity at the falling edge of the input current signal Ipd and decrease the sensitivity at the rising edge of the input current signal Ipd. More alternatively, the NPN transistors may be replaced with NMOS transistors.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A light receiving circuit comprising:
   a photodiode that outputs a photocurrent in response to a received light signal;
   a first amplifier including a feedback resistor connected between an input terminal and an output terminal of an inverting amplifier, and having an input terminal connected to a cathode of the photodiode;
   a second amplifier having a configuration similar to that of the first amplifier, and having an input terminal connected to an anode of the photodiode;
   a capacitor element connected between an output terminal of the first amplifier and the input terminal of the second amplifier; and
   a bias current control circuit that outputs a bias current to the input terminal of the second amplifier according to a current value of the photocurrent, and controls an output voltage signal according to an output of the second amplifier by using the bias current to adjust sensitivity of the light receiving circuit,
   wherein the bias current control circuit changes the sensitivity according to the output of the second amplifier.

2. The light receiving circuit according to claim 1, wherein the bias current control circuit comprises a third amplifier having a configuration similar to that of the first amplifier, and
   the third amplifier outputs the bias current according to the current value of the photocurrent.

3. The light receiving circuit according to claim 2, further comprising a fourth amplifier that has a configuration similar to that of the first amplifier and outputs a signal according to the output of the second amplifier,
   wherein a control terminal of an output transistor of the third amplifier and a control terminal of an output transistor of the fourth amplifier are connected to each other.

4. The light receiving circuit according to claim 1, wherein the first amplifier comprises a first transistor serving as an input transistor, a second transistor serving as an output transistor, and first to third resistors,
   the first resistor has one terminal connected to a first power supply voltage terminal, and another terminal connected to a first node,
   the first transistor has one terminal connected to the first node, another terminal connected to a second power supply voltage terminal, and a control terminal connected to the input terminal of the first amplifier,
   the second transistor has one terminal connected to the first power supply voltage terminal, another terminal connected to the output terminal of the first amplifier, and a control terminal connected to the first node,
   the second resistor has one terminal connected to the output terminal of the first amplifier, and another terminal connected to the second power supply voltage terminal, and
   the third resistor has one terminal connected to the input terminal of the first amplifier, and another terminal connected to the output terminal of the first amplifier.

5. The light receiving circuit according to claim 1, wherein the light receiving circuit is used on a reception side of the photocoupler.

* * * * *